(12) United States Patent
Dinkelbach et al.

(10) Patent No.: US 11,687,474 B2
(45) Date of Patent: Jun. 27, 2023

(54) SIGNAL PROCESSING SYSTEM AND SIGNAL PROCESSING METHOD

(71) Applicant: Rohde & Schwarz GmbH & Co. KG, Munich (DE)

(72) Inventors: Horst Dinkelbach, Munich (DE); Matthias Ruengeler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 166 days.

(21) Appl. No.: 17/182,650

(22) Filed: Feb. 23, 2021

(65) Prior Publication Data

US 2022/0269626 A1   Aug. 25, 2022

(51) Int. Cl.
*G06F 13/36* (2006.01)
*H03H 17/02* (2006.01)

(52) U.S. Cl.
CPC ......... *G06F 13/36* (2013.01); *H03H 17/0219* (2013.01)

(58) Field of Classification Search
None
See application file for complete search history.

(56) References Cited

U.S. PATENT DOCUMENTS

| | | | |
|---|---|---|---|
| 5,268,761 A * | 12/1993 | White | H04N 5/52 348/685 |
| 5,388,062 A | 2/1995 | Knutson | |
| 5,463,893 A * | 11/1995 | Pla | H04R 3/002 73/1.82 |
| 5,497,402 A * | 3/1996 | Pyo | H04L 27/2273 455/75 |
| 5,698,984 A | 12/1997 | Little et al. | |
| 6,232,760 B1 | 5/2001 | Eckert | |
| 6,243,576 B1 * | 6/2001 | Seike | H04B 17/23 455/418 |
| 6,501,329 B1 * | 12/2002 | Petrofsky | H03H 17/0294 327/552 |
| 8,638,878 B2 * | 1/2014 | Li Puma | H04L 27/361 375/296 |
| 2003/0161420 A1 | 8/2003 | Pupalaikis | |

FOREIGN PATENT DOCUMENTS

DE   102017118124 A1   2/2019

\* cited by examiner

*Primary Examiner* — Elias Mamo
(74) *Attorney, Agent, or Firm* — Christensen O'Connor Johnson Kindness PLLC

(57) ABSTRACT

A signal processing system is described. The signal processing system includes at least one signal processing path and a control module. The at least one signal processing path includes at least one signal input and at least two filter units. The at least two filter units include at least one hardware filter unit. The at least one signal input is connectable to at least one external electronic component. The control module is connected to the signal input and to the at least two hardware filter units. The control module is configured to determine a frequency response deviation being associated with the at least one external electronic component. The control module further is configured to reconfigure the at least one hardware filter unit such that the frequency response deviation is compensated at least partially. Further, a signal processing method for adapting filter coefficients of a signal processing system is described.

24 Claims, 5 Drawing Sheets

SIGNAL PROCESSING SYSTEM AND SIGNAL PROCESSING METHOD

FIELD OF THE DISCLOSURE

Embodiments of the present disclosure generally relate to a signal processing system. Embodiments of the present disclosure further relate to a signal processing method for adapting filter coefficients of a signal processing system.

BACKGROUND

Almost all signal-processing electronic devices, particularly measurement instruments such as signal analyzers, oscilloscopes, or even vector network analyzers, have several signal filters in their processing chains.

For example, there may be filters just after an analog-to-digital converter in an ASIC or FPGA, filters at the end of decimation in the FPGA/ASIC, and/or software filters.

Usually, each filter is designed for one specific target, e.g. alignment, video filtering, or compensation of specific customer equipment.

However, these targets may change such that more or other sources of distortion have to be compensated. For example, new user equipment may be plugged into the respective electronic device, such that an additional source of signal distortions may be present for which the electronic device has not been designed originally.

Compensating these additional distortions requires either an expensive re-design of the electronic device or a reconfiguration of software-filters within the electronic device, which may result in a considerably lower processing speed.

Accordingly, there is a need for a signal processing system that allows for a more efficient compensation of additional disturbances.

SUMMARY

Embodiments of the present disclosure provide examples of a signal processing system. In an embodiment, the signal processing system comprises at least one signal processing path and a control module composed of, for example, one or more circuits. The at least one signal processing path comprises at least one signal input and at least two filter units. The at least two filter units comprise at least one hardware filter unit. The at least one signal input is connectable to at least one external electronic component. The control module is connected to the signal input and to the at least two filter units. The control module is configured to determine a frequency response deviation being associated with the at least one external electronic component. The control module further is configured to reconfigure the at least one hardware filter unit such that the frequency response deviation is compensated at least partially.

The signal processing systems according to the present disclosure are based on the idea to use the at least one hardware filter unit, which is already present in the signal processing system but may be configured for another purpose, in order to compensate disturbances caused by the at least one external electronic component.

In other words, disturbances caused by external electronic components are compensated by a reconfiguration of at least one already present hardware filter unit at least partially, for example completely.

Accordingly, the signal processing system according to the present disclosure does not have to be redesigned if new external electronic components are attached to the signal processing system. Instead, the already present hardware is reconfigured by the control module.

Moreover, the signal processing speed of the signal processing system is not impaired, as the additional disturbances are corrected with the at least one hardware filter unit instead of additional software filters.

In some embodiments, the control module may be configured to adapt filter parameters of the at least one hardware filter unit in order to reconfigure the at least one hardware filter unit.

Generally, the at least two filter units may correspond to two hardware filter units or rather one hardware filter unit and a software filter. However, the at least two filter units may also comprise an arbitrary number of hardware filter units and software filters.

According to an aspect of the present disclosure, the control module is configured to at least one of determine or receive a target aggregate frequency response, the target aggregate frequency response being associated with both the at least one external electronic component and the at least one signal processing path. The target aggregate frequency response corresponds to an ideal frequency response for the complete signal chain from and including the external electronic component to and including the signal processing path. The target aggregate frequency response may be specified by a standard associated with the external electronic component. For example, the target aggregate frequency response may be input by a user of the signal processing system. Alternatively or additionally, the target aggregate frequency response may be downloaded from a corresponding database. Alternatively or additionally, the target aggregate frequency response may be determined by the control module automatically.

Accordingly, the frequency response deviation may be a deviation of an actual frequency response of the signal chain from and including the external electronic component to and including the signal processing path from the target aggregate frequency response.

According to another aspect of the present disclosure, the control module is configured to reconfigure the at least one hardware filter unit based on the target aggregate frequency response. In other words, the control module is configured to adapt a respective frequency response of the at least one hardware filter unit such that the complete signal chain from and including the external electronic component to and including the signal processing path has the target aggregate frequency response.

In a further embodiment of the present disclosure, the signal processing system comprises a user interface, wherein the target aggregate frequency response is adaptable by the user interface. In other words, a user may set the target aggregate frequency response via the user interface.

In some embodiments, the user interface may be established as a graphical user interface (GUI) or rather an interface for Standard Commands for Programmable Instruments (SCPI).

The control module may be configured to at least one of determine and receive at least one target computation parameter, the target computation parameter being associated with requirements regarding the target aggregate frequency response. In general, the target computation parameter is a further condition for the reconfiguration of the at least two hardware filter units that is considered by the control module for the reconfiguration of the at least two hardware filter units.

The target computation parameter may be preset and/or adjustable by a user.

The signal processing system may comprise a user interface, wherein the at least one target computation parameter is adaptable by the user interface. In other words, a user may set the target computation parameter via the user interface.

In some embodiments, the user interface may be established as a graphical user interface (GUI) or rather an interface for Standard Commands for Programmable Instruments (SCPI).

In an embodiment of the present disclosure, the target computation parameter is associated with at least one of a target computation accuracy, a target computation time, a target energy consumption, a trigger impact, a ripple in amplitude, a ripple in phase, and/or a filter optimization criterion.

Therein, the term "trigger impact" is understood to denote whether a trigger within the at least one signal processing path is affected by the reconfiguration or not. The target computation parameter may be associated with a target trigger accuracy, i.e. to a target computation accuracy of all filters upstream of the trigger combined. Accordingly, the control module may be configured to reconfigure the filter units upstream of the trigger based on the target trigger accuracy depending on a position of the trigger in the signal processing path.

In some embodiments, the target trigger accuracy may be adaptable by a user interface of the signal processing system, such that a user can input a desired target trigger accuracy.

Accordingly, the respective filter units are optimized before the location of the trigger in the at least one signal processing path in order to achieve a user given accuracy/default accuracy.

The filter optimization criterion may relate to an optimization technique used for the reconfiguration of the at least one hardware filter unit, for example a least (mean) squares criterion, a group delay criterion, etc.

If, e.g., the energy consumption of the signal processing system is to be reduced, the control module may be configured to turn off one or more hardware filter units.

If, e.g., a very high computation accuracy is to be achieved, the control module may be configured to turn on a long software filter in order to achieve the desired computation accuracy. In a further embodiment of the present disclosure, the control module is configured to at least one of determine and receive filter property information being associated with the at least one hardware filter unit. In other words, the control module may receive and/or determine information on general and detailed properties of the at least one hardware filter unit, and particularly information on which of these properties are reconfigurable and which of these properties are not reconfigurable.

In some embodiments, the control module is configured to reconfigure the at least one hardware filter unit based on the filter property information.

According to an aspect of the present disclosure, the filter property information comprises information on at least one of a number of filter taps, filter coefficients being real or complex, a sampling rate, a center frequency, a dynamic range, bits available for each hardware filter unit, an order of the at least two filter units in the at least one signal processing path, side parameters, and/or zero stuffing. Zero stuffing may also be called zero padding. The term zero stuffing means that zeros are assigned to certain filter taps (e.g. free filter taps), for example in frequency domain.

Alternatively or additionally, the filter property information may comprise a location of a trigger in the at least one signal processing path.

According to another aspect of the present disclosure, the at least two filter units comprise at least two hardware filter units. Accordingly, the control module may be configured to reconfigure the at least two hardware filter units such that the frequency response deviation is compensated at least partially, for example completely.

In a further embodiment of the present disclosure, the control module is configured to reconfigure the at least two hardware filter units in a consecutive manner. In other words, the control module may be configured to first reconfigure the first one of the at least two hardware filter units, such that the frequency response deviation is partially compensated. The control module may further be configured to determine a remaining frequency response deviation and then reconfigure another one of the at least two hardware filter units, such that the remaining frequency deviation is compensated at least partially, for example completely.

This way, the control module may consecutively reconfigure the at least two hardware filter units, and optionally further hardware filter units of the at one signal processing path, until the frequency response deviation is compensated up to a predetermined accuracy.

According to another aspect of the present disclosure, the at least one signal processing path comprises at least one software filter unit, the at least one software filter unit being connected to the control module, and the control module being configured to reconfigure the at least one software filter unit in addition to the reconfiguration of the at least one hardware filter unit such that the frequency response deviation is compensated. In general, the control module is configured to compensate the frequency response deviation as much as possible by a reconfiguration of the hardware filter unit(s). However, if after the reconfiguration of the hardware filter unit(s) there is still a remaining frequency response deviation, the remaining frequency response deviation may be compensated by a reconfiguration of the at least one software filter unit.

In an embodiment of the present disclosure, the control module is configured to reconfigure the at least one hardware filter unit and the at least one software filter unit in a consecutive manner, wherein the at least one software filter is reconfigured after the at least one hardware filter unit. If the at least two filter units comprise two or more hardware filter units, all of the hardware filter units may be reconfigured before the at least one software filter unit. In other words, the control module may be configured to first reconfigure a first one of the at least two hardware filter units, such that the frequency response deviation is partially compensated. The control module may further be configured to determine a remaining frequency response deviation and then reconfigure another one of the at least two hardware filter units, such that the remaining frequency deviation is compensated at least partially, for example completely. If there is still a remaining frequency response deviation after all hardware filter units have been reconfigured, the control module may reconfigure the at least one software filter unit such that the remaining frequency response deviation is compensated.

The control module may be configured to reconfigure the at least two filter units by a global optimization of filter coefficients of the at least two filter units. In other words, the at least two (hardware) filter units may not be reconfigured individually, but rather simultaneously by the global optimization of the filter coefficients of all of the at least two (hardware) filter units. It has turned out that the frequency response deviation can be compensated in a more efficient and precise manner by the global optimization of the filter coefficients instead of individual optimizations of the filter coefficients of the individual (hardware) filter units.

In some embodiments, the control module may be configured to reconfigure the at least one hardware filter unit and the at least one software filter unit by a global optimization of filter coefficients of the at least one hardware filter unit and of filter coefficients of the at least one software filter unit.

According to a further aspect of the present disclosure, the signal processing system comprises at least one further signal processing path, the at least one further signal processing path comprising a signal input and at least two filter units, the at least two filter units comprising at least one hardware filter unit, the at least one signal input of the at least one further signal processing path being connectable to at least one external electronic component, the control module being connected to the signal input and to the at least two filter units of the at least one further signal processing path, the control module being configured to determine a frequency response deviation being associated with the at least one external electronic component, and the control module further being configured to reconfigure the at least one hardware filter unit of the at least one further signal processing path such that the frequency response deviation is compensated at least partially.

In some embodiments, the control module may be configured to treat the signal processing paths independently of each other. In other words, the reconfiguration of the hardware filter units of one signal processing path is independent of the reconfiguration of the hardware filter units of another signal processing path.

It is noted that the other aspects described above in the context of the at least one signal processing path also apply to the at least one further signal processing path.

According to an aspect of the present disclosure, the signal processing system comprises an analysis module, the analysis module being connected to the at least one signal processing path and to the at least one further signal processing path, and the analysis module being configured to perform multi-channel measurements, namely measurements on multiple channels. In other words, the analysis module may receive and analyze input signals processed via the different signal processing paths.

For example, the multi-channel measurements may relate to a stopband suppression, a signal strength, and/or spurious signals.

Alternatively or additionally, the analysis module may be configured to combine the input signals processed via the different signal processing paths, for example if the input signals are located in different frequency bands (which, however, may overlap). This is also called "stitching".

According to a further aspect of the present disclosure, the control module is configured to reconfigure the filter units of the at least one signal processing path and the filter units of the at least one further signal processing path by a global optimization of filter coefficients of the filter units.

In some embodiments, if the frequency bands associated with the different input signals overlap, the control module may perform a joint optimization of the filter coefficients of the filter units of the different signal processing paths at least in an overlap region of the frequency bands.

In a further embodiment of the present disclosure, the at least one external electronic component comprises at least one of a device under test, an external front end, an external amplifier, a cabling, a probe, and/or user equipment.

In some embodiments, the at least one hardware filter unit is established as an analog filter unit composed of, for example, one or more analog circuit elements or as a digital filter unit composed of, for example, one or more digital filter elements. Therein, the signal processing module may comprise an arbitrary combination of analog hardware filter units and digital hardware filter units.

Embodiments of the present disclosure further provide examples of a signal processing method for adapting filter coefficients of a signal processing system. The signal processing system comprises at least one signal processing path and a control module composed of, for example, one or more circuits. The at least one signal processing path comprises at least one signal input and at least two filter units. The at least two filter units comprise at least one hardware filter unit. The at least one signal input is connectable to at least one external electronic component. In an embodiment, the signal processing method comprises the following steps:

determining a frequency response deviation being associated with the at least one external electronic component by the control module; and adapting filter coefficients of at least one of the at least two filter units such that the frequency response deviation is compensated at least partially;

wherein the filter coefficients are adapted by a global optimization of the filter coefficients.

It has turned out that the frequency response deviation can be compensated in a more efficient and precise manner by the global optimization of the filter coefficients instead of individual optimizations of the filter coefficients of the individual filter units.

Regarding the remaining advantages and properties of the signal processing method, reference is made to the explanations given above with respect to the signal processing system, which also hold for the signal processing method and vice versa.

According to an aspect of the present disclosure, the filter coefficients are adapted by a least squares technique. For example, a cost functional may be provided, wherein the cost functional depends on the filter coefficients of all filter units, on an actual frequency response of the complete signal chain from and including the external electronic component to and including the signal processing path, and on an (ideal) reference frequency response. The cost functional may be a measure for the deviation of the actual frequency response of the complete signal chain from the reference frequency response.

Accordingly, the cost functional may be minimized in order to determine the new filter coefficients for the filter units, for example the new filter coefficients of the at least one hardware filter unit, by the least squares technique.

According to another aspect of the present disclosure, a target aggregate frequency response is at least one of determined and received, the target aggregate frequency response being associated with both the at least one external electronic component and the at least one signal processing path, wherein the filter coefficients are adapted based on the target aggregate frequency response. The target aggregate frequency response corresponds to an ideal frequency response for the complete signal chain from and including the external electronic component to and including the signal processing path. Thus, the target aggregate frequency response may serve as the reference frequency response in the cost functional described above.

In an embodiment of the present disclosure, at least one target computation parameter is at least one of determined and received, wherein the filter coefficients are adapted based on the target computation parameter.

In general, the target computation parameter is a further condition for the reconfiguration of the at least two hardware filter units that is considered by the control module for the reconfiguration of the at least two hardware filter units.

The target computation parameter may be preset and/or adjustable by a user.

In an embodiment of the present disclosure, the target computation parameter is associated with at least one of a target computation accuracy, a target computation time, a target energy consumption, a trigger impact, a ripple in amplitude, a ripple in phase, and/or a filter optimization criterion.

Therein, the term "trigger impact" is understood to denote whether a trigger within the at least one signal processing path is affected by the reconfiguration or not. For example, the target computation parameter may be associated with a target trigger accuracy, i.e. to a target computation accuracy of all filters upstream of the trigger combined. Accordingly, the control module may be configured to reconfigure the filter units upstream of the trigger based on the target trigger accuracy depending on a position of the trigger in the signal processing path.

In some embodiments, the target trigger accuracy may be adaptable by a user interface of the signal processing system, such that a user can input a desired target trigger accuracy.

The filter optimization criterion may relate to an optimization technique used for the reconfiguration of the at least two filter units, for example a least (mean) squares criterion, a group delay criterion, etc.

In a further embodiment of the present disclosure, filter property information being associated with the at least one hardware filter unit is at least one of determined and received, wherein the filter coefficients are adapted based on the filter property information.

In other words, the control module may receive and/or determine information on general and detailed properties of the at least one hardware filter unit, and particularly information on which of these properties are reconfigurable and which of these properties are not reconfigurable.

In some embodiments, the control module is configured to reconfigure the at least one hardware filter unit based on the filter property information.

According to an aspect of the present disclosure, the filter property information comprises information on at least one of a number of filter taps, filter coefficients being real or complex, a sampling rate, a center frequency, a dynamic range, bits available for each hardware filter unit, an order of the at least two filter units in the at least one signal processing path, side parameters, and/or zero stuffing. Zero stuffing may also be called zero padding. The term zero stuffing means that zeros are assigned to certain filter taps (e.g. free filter taps), for example in frequency domain.

Alternatively or additionally, the filter property information may comprise a location of a trigger in the at least one signal processing path.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
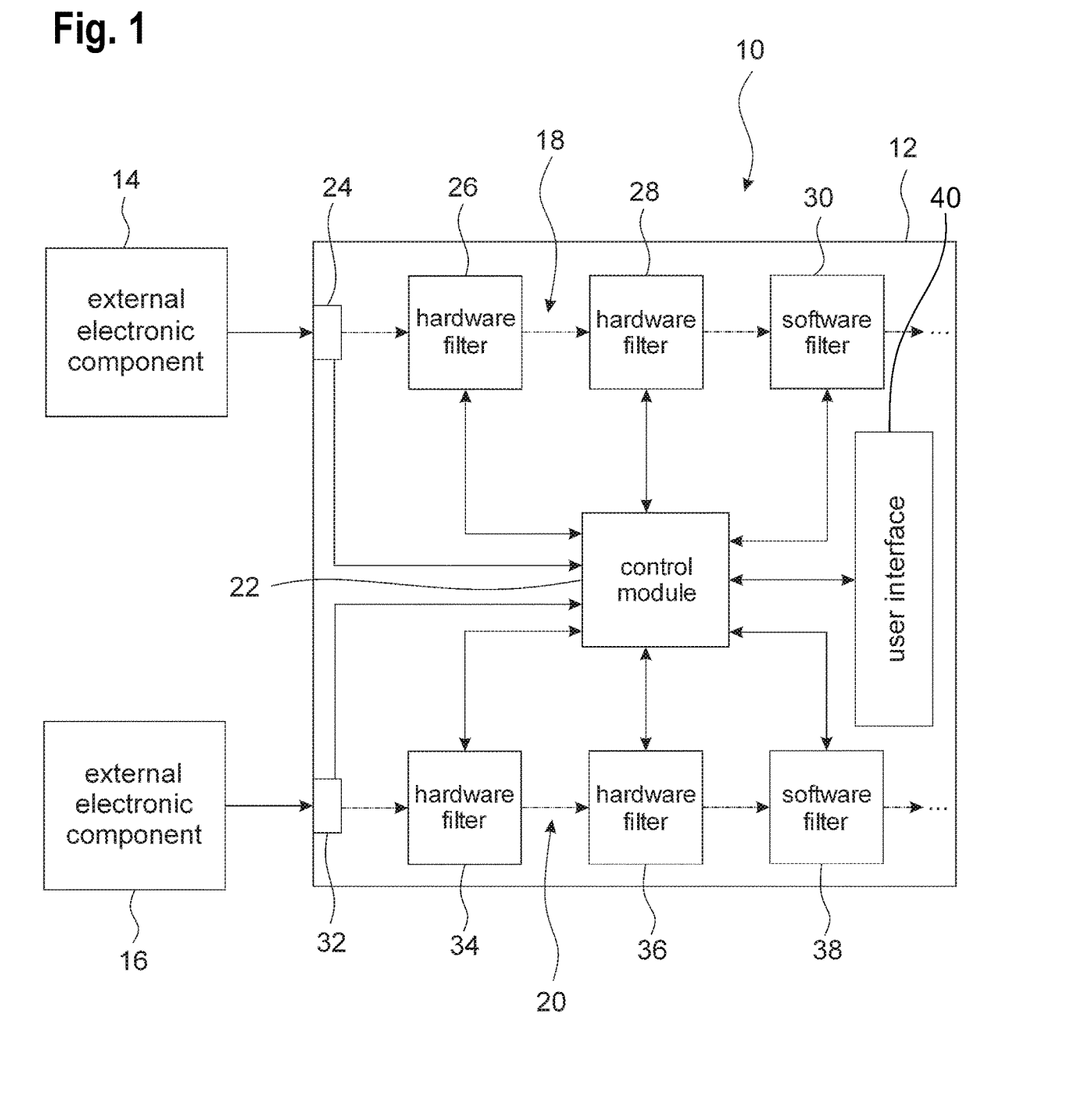
FIG. 1 schematically shows a first embodiment of a signal processing system according to the present disclosure.

FIG. 1 schematically shows an example of a signal processing system 10 comprising a signal-processing electronic device 12, a first external electronic component 14, and a second external electronic component 16.

Generally, the electronic device 12 may be established as any kind of electronic device that is configured to process electric signals and that comprises at least one hardware filter unit. In some embodiments, the electronic device 12 is established as a measurement instrument, for example as a signal analyzer, as an oscilloscope, or as a vector network analyzer. As a further example, the electronic device 12 may be established as a radio communication device, for example as a mobile communication device.

The first external electronic component 14 and the second external electronic component 16 are established as any type of signal-generating or signal-processing electronic device that can be used in combination with the electronic device 12. For example, if the electronic device 12 is established as a measurement instrument, the first external electronic component 14 and/or the second external electronic component 16 may be established as a device under test, as an external front end, as an external amplifier, as cabling, and/or as a measurement probe. As a further example, if the electronic device established as a radio communication device, the first external electronic component 14 and/or the second external electronic component 16 may be established as user equipment, such as a headphone, a microphone, etc.

It is noted that while only a single first external electronic component 14 and a single second electronic component 16 are shown in FIG. 1, there may be several first external electronic components 14 and/or several second external electronic components 16. The several first external electronic components 14 may be arranged in a serial and/or parallel connection, i.e. in an arbitrary topology. The several second external electronic components 16 may be arranged in a serial and/or parallel connection, i.e. in an arbitrary topology.

The electronic device 12 comprises a first signal processing path 18, a second signal processing path 20, and a control module 22 composed of, for example, one or more circuits.

In some embodiments, the term "module" refers to or includes, inter alia, a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

The first signal processing path 18 comprises a first signal input 24 connected to the first external electronic component 14, a first hardware filter unit 26, and a second hardware filter unit 28. Optionally, the first signal processing path 18 comprises a first software filter unit 30.

The second signal processing path 20 comprises a second signal input 32 connected to the second external electronic component 16, a third hardware filter unit 34, and a fourth hardware filter unit 36. Optionally, the second signal processing path 20 comprises a second software filter unit 38.

The control module 22 is connected to the signal inputs 24, 32 in a signal transmitting manner. Moreover, the control module 22 is connected to each of the hardware filter units 26, 28, 34, 36 and to each of the software filter units 30, 38 in a signal transmitting manner Therein and in the following, the term "connected in a signal transmitting manner" is understood to denote a cable-based or wireless connection that is configured to transmit signals (e.g. measurement signals) and/or configuration data (e.g. filter configuration data) between the respective devices or components.

Optionally, the electronic device 12 may comprise a user interface 40 that is connected to the control module 22. The user interface 40 may comprise a display and/or input interfaces that are configured to receive user commands, for example buttons, knobs, and/or a touch-sensitive display. In some embodiments, the user interface 40 may be established as a graphical user interface.

Figure 2:
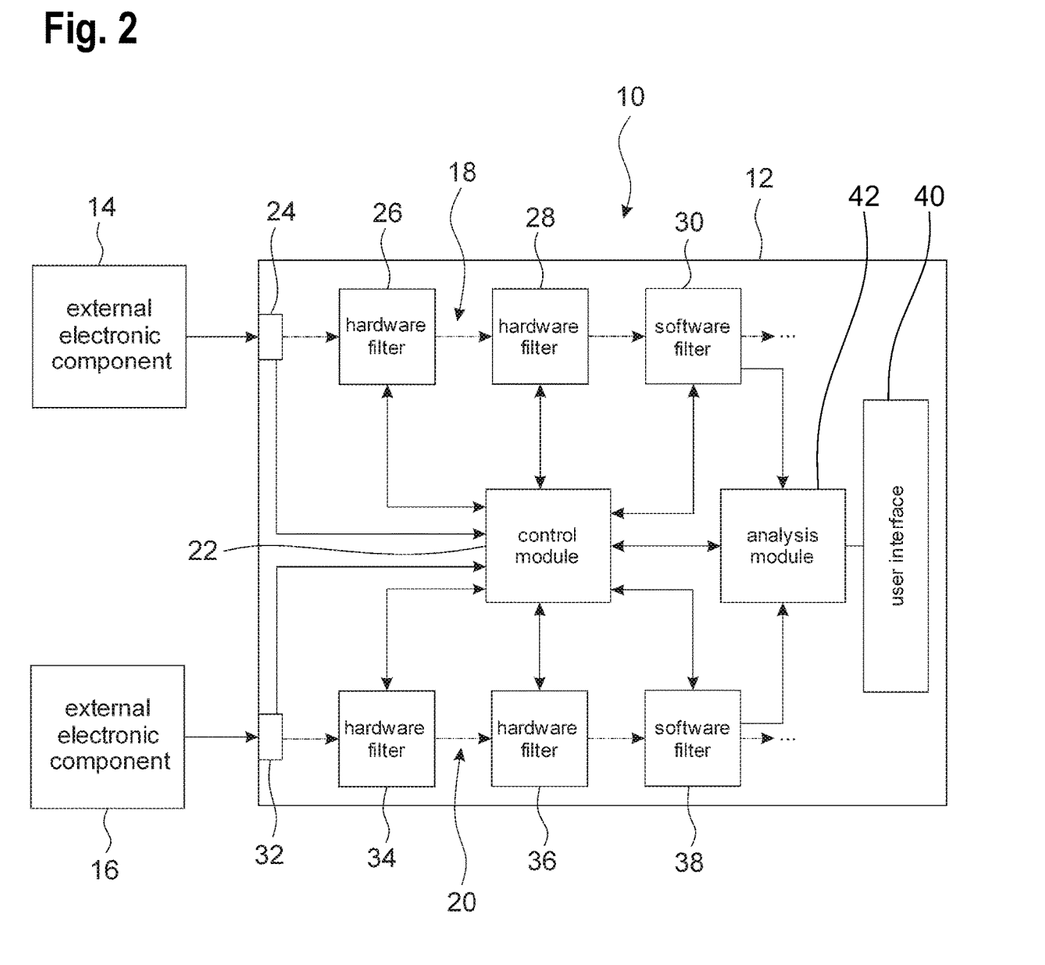
FIG. 2 schematically shows a second embodiment of a signal processing system according to the present disclosure.

FIG. 2 shows a second embodiment of the signal processing system 10, wherein only the differences compared to the first embodiment described above will be explained in the following.

The electronic device 12 comprises an analysis module 42 composed of, for example, one or more circuits. The analysis module is connected with the first software filter 30 and with the second software filter 38 in a signal-transmitting manner. Moreover, the analysis module 42 may be connected with the user interface 40 and/or the control module 22 in a signal-transmitting manner. In general, the analysis module 42 may be configured to perform multi-channel measurements, namely measurements on multiple channels. In other words, the analysis module 42 receives and analyzes input signals processed via the different signal processing paths 18, 20.

Figure 3:
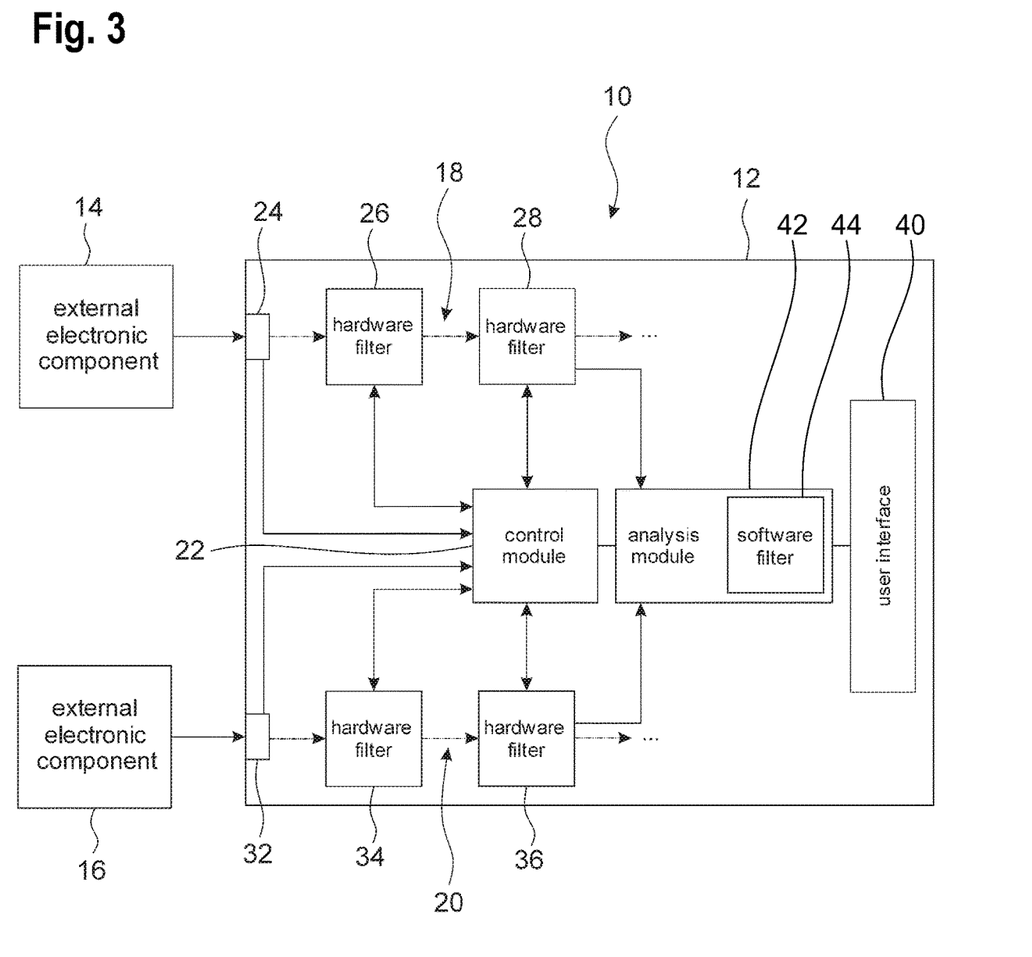
FIG. 3 schematically shows a third embodiment of a signal processing system according to the present disclosure.

FIG. 3 shows a third embodiment of the signal processing system 10, wherein only the differences compared to the second embodiment described above will be explained in the following. Here, the first signal-processing path 18 and the second signal processing path 20 do not comprise any software filter units. Thus, the analysis module 42 is connected with the second hardware filter unit 28 and with the fourth hardware filter unit 36 in a signal transmitting manner. Moreover, the analysis module 44 comprises a (single) software filter unit 44.

Figure 4:
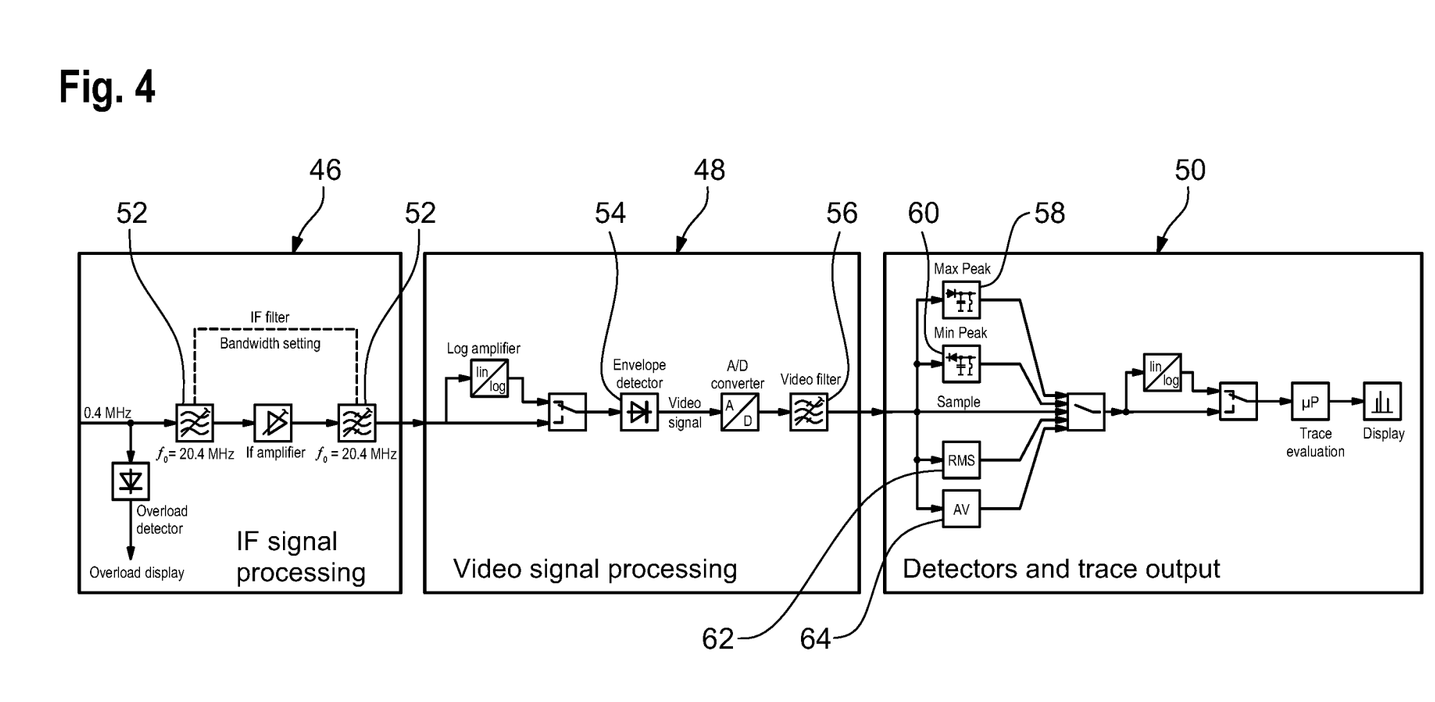
FIG. 4 schematically shows a representative signal processing path.

FIG. 4 shows a representative signal processing path that may be integrated into an electronic device 12 according to any of the embodiments described above. In this particular example, the respective signal processing path comprises an IF signal processing module 46 having one or more processing circuits, a video signal processing module 48 having one or more processing circuits, and a detector and trace output module 50.

Each of the modules may comprise one or several hardware filters. For example, the IF signal processing module comprises band pass filters 52 with variable center frequency.

The video signal processing module 48 comprises an envelope detector 54 and a video filter 56. The detector and trace output module 50 comprises a Max Peak filter 58, a Min Peak filter 60, an RMS filter 62, and an AV filter 64 that are arranged in parallel.

It is to be understood that this signal processing path constitutes only an example for illustrative purposes. Of course, the signal processing paths 18, 20 of the electronic device 12 may comprise any other type of hardware filter.

In general, the external electronic components 14, 16 may cause distortions in the first signal processing path 18 and the second signal processing path 20.

In some embodiments, if new types or models of external electronic components are connected to the electronic device 12, this means that new or other types of distortions that have to be compensated.

Generally speaking, the electronic device 12 is configured to compensate for these additional distortions with the filter units 26, 28, 30, 34, 36, 38 that are already available within the electronic device 12. More precisely, the electronic device 12 is configured to perform a signal processing method that is described in the following with reference to FIG. 5.

Figure 5:
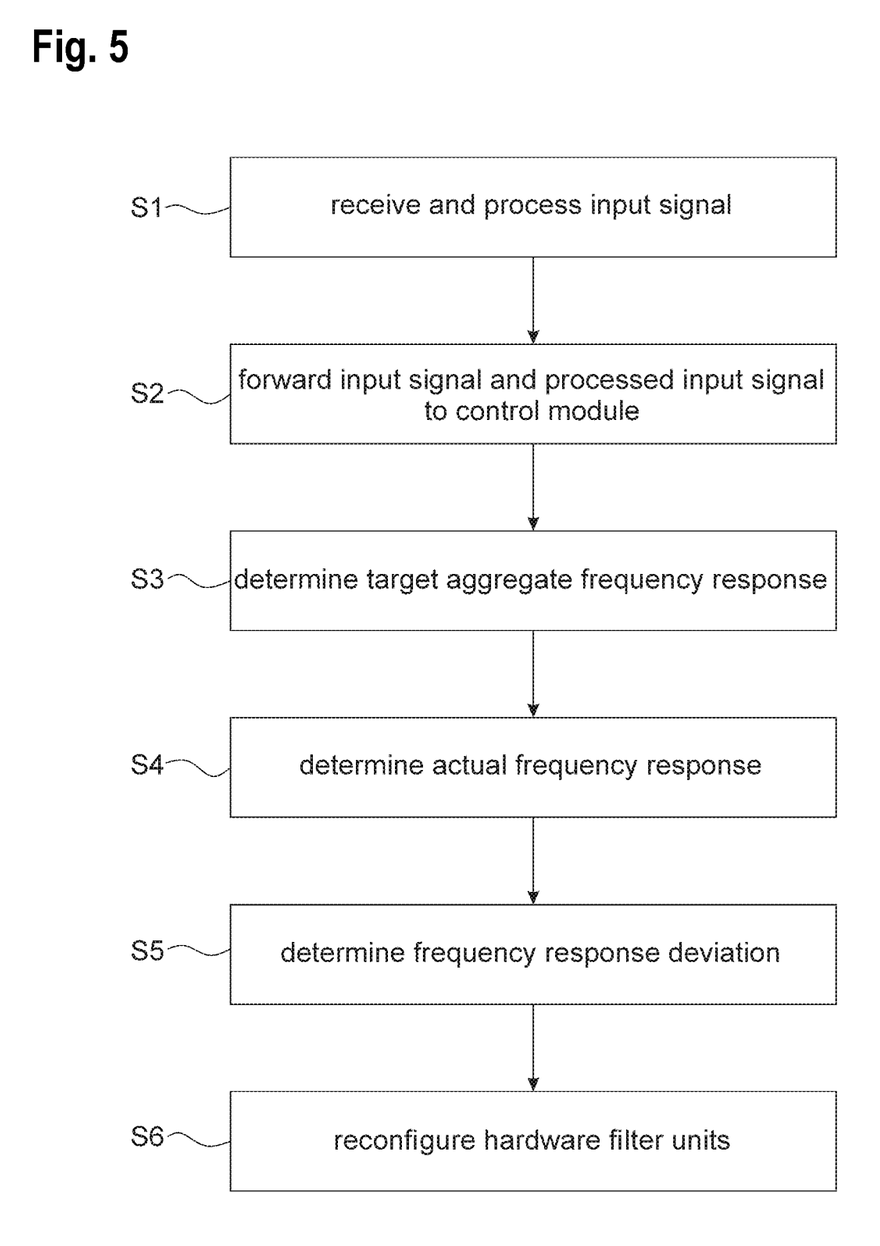
FIG. 5 shows a flow chart of a signal processing method according to an embodiment of the present disclosure.

It is noted that the signal processing method is at first described in the context of the first embodiment of the signal processing system 10 shown in FIG. 1. An input signal from the first external electronic component 14 is received and processed by the first signal processing path 18 (step S1). Additionally, a further input signal may be received from the second external electronic component 16 by the second signal processing path 20.

In the following, the signal processing method is described only for the first signal processing path 18. However, it is to be understood that the same steps described in the following can also be performed for the second signal processing path 20, for example independently of the first signal processing path 18.

The input signal and the input signal processed by the first hardware filter unit 26, the second hardware filter unit 28, and the first software filter unit 30 is forwarded to the control module 22 (step S2).

A target aggregate frequency response is determined and/or or received by the control module 22 (step S3). The target aggregate frequency response is associated with both the first external electronic component 14 and the first signal processing path 18.

The target aggregate frequency response corresponds to an ideal frequency response for the complete signal chain from and including the first external electronic component 14 to and including the first signal processing path 18. The target aggregate frequency response may be specified by a standard associated with the first external electronic component 14. For example, the target aggregate frequency response may be input by a user of the signal processing system 10.

In some embodiments, the target aggregate frequency response may be adaptable by the user interface 40. In other words, a user may set the target aggregate frequency response via the user interface 40. Alternatively or additionally, the target aggregate frequency response may be downloaded from a corresponding database.

An actual frequency response for the complete signal chain from and including the first external electronic component 14 to and including the first signal processing path 18 is determined by the control module 22 based on the input signal and based on the input signal processed by the filter units 26, 28, 30 (step S4).

A frequency response deviation being associated with the first external electronic component 14 is determined by the control module 22 based on the target aggregate frequency response and based on the actual frequency response (step S5). In some embodiments, the frequency response deviation is a deviation of the actual frequency response of the signal chain from and including the first external electronic component 14 to and including the first signal processing path 18 from the target aggregate frequency response.

At least the first hardware filter unit 26 and the second hardware filter unit 28 are reconfigured by the control module 22 based on the frequency response deviation (step S6). In some embodiments, the control module 22 adapts the respective frequency response of the hardware filter units 26, 28 such that the frequency response deviation is reduced, for example minimized. In other words, the control module 22 adapts filter coefficients of the hardware filter units 26, 28 such that the frequency response deviation is reduced, for example minimized Optionally, the control module 22 may determine and/or receive at least one target computation parameter, wherein the target computation parameter is associated with requirements regarding the target aggregate frequency response.

The at least one target computation parameter may be adaptable by the user interface 40. In other words, a user may set the target aggregate frequency response via the user interface 40. In general, the target computation parameter is a further condition for the reconfiguration of the hardware filter units 26, 28 that is considered by the control module 22 for the reconfiguration of the hardware filter units 26, 28.

The target computation parameter may be associated with a target computation accuracy, a target computation time, a target energy consumption, a trigger impact, a ripple in amplitude, a ripple in phase, and/or a filter optimization criterion.

In some embodiments, the control module 22 may estimate a current computation accuracy, and the estimated computation accuracy may be displayed on the display 40. In other words, performance results are shown to the user via the display 40.

Based on the estimated computation accuracy, the user may decide whether further changes to the filter configurations are necessary. For example, the user may decide to turn on/off the software filter units 30, 38.

Therein, the term "trigger impact" is understood to denote whether a trigger within the at least one signal processing path is affected by the reconfiguration or not. For example, the target computation parameter may be associated with a target trigger accuracy, i.e. to a target computation accuracy of all filters 26, 28, 30 upstream of the trigger combined. Accordingly, the control module 22 may reconfigure the filter units 26, 28, 30 upstream of the trigger based on the target trigger accuracy depending on a position of the trigger in the signal processing path 18.

In some embodiments, the target trigger accuracy may be adaptable by the user interface 40, such that a user can input a desired target trigger accuracy.

The filter optimization criterion may relate to an optimization technique used for the reconfiguration of the hardware filter units 26, 28, for example a least (mean) squares criterion, a group delay criterion, etc. Optionally, the control module 22 may determine and/or receive filter property information being associated with the hardware filter units 26, 28. In other words, the control module 22 may receive and/or determine information on general and detailed properties of the hardware filter units 26, 28, and particularly information on which of these properties are reconfigurable and which of these properties are not reconfigurable.

The filter property information may comprise information on at least one of a number of filter taps, filter coefficients being real or complex, a sampling rate, a center frequency, a dynamic range, bits available for each hardware filter unit 26, 28, an order of the hardware filter units 26, 28 in the first signal processing path 18, side parameters, and/or zero stuffing. Zero stuffing may also be called zero padding. The term zero stuffing means that zeros are assigned to certain filter taps (e.g. free filter taps), for example in frequency domain. Alternatively or additionally, the filter property information may comprise a location of a trigger in the first signal processing path 18, e.g. in the filter chain.

In some embodiments, the control module 22 may reconfigure the hardware filter units 26, 28 based on the filter property information. In general, the hardware filter units 26, 28 may be reconfigured either consecutively or simultaneously.

If the hardware filter units 26, 28 are reconfigured consecutively, the control module 22 first reconfigures a first one of the hardware filter units 26, 28, such that the frequency response deviation is partially compensated. The control module 22 may then determine a remaining frequency response deviation and reconfigure another one of the hardware filter units 26, 28, such that the remaining frequency deviation is compensated at least partially, for example completely.

If, after reconfiguration of the hardware filter units 26, 28, the remaining frequency response deviation is still too large, the control module 22 may reconfigure the first software filter unit 30 such that the remaining frequency response deviation is compensated.

If the hardware filter units 26, 28 are reconfigured simultaneously, the control module 22 may reconfigure the hardware filter units 26, 28 by a global optimization of filter coefficients of the hardware filter units 26, 28. For example, a cost functional may be provided, wherein the cost functional depends on the filter coefficients of the hardware filter units 26, 28, on the actual frequency response of the complete signal chain from and including the first external electronic component 14 to and including the first signal processing path 18, and on the target aggregate frequency response.

The cost functional is a measure for the deviation of the actual frequency response of the complete signal chain from the target aggregate frequency response. Accordingly, the cost functional may be minimized in order to determine the new filter coefficients for the hardware filter units 26, 28, e.g. by a least squares technique.

The at least one target computation parameter described above may be a side constraint for the optimization of the filter coefficients. Optionally, the first software filter unit 30 may be included in the global optimization of the filter coefficients, such that the hardware filter units 26, 28 and the first software filter unit 30 are reconfigured simultaneously.

Now relating to the embodiment of the signal processing system 10 shown in FIG. 2, the signal processing method described above may be modified as follows:

In general, the analysis module 42 may be configured to perform multi-channel measurements. In other words, the analysis module 42 may receive and analyze input signals processed via the first signal processing path 18 and the second signal processing path 20.

For example, the multi-channel measurements may relate to a stopband suppression, a signal strength, and/or spurious signals.

Alternatively or additionally, the analysis module may be configured to combine the input signals processed via the different signal processing paths 18, 20, for example if the input signals are located in different frequency bands, wherein the different frequency bands may overlap. This may also be called "stitching".

Thus, the steps S1 to S6 described above may be modified such that the filter coefficients of the filter units 26, 28, 30, 34, 36, 38 are optimized for such multi-channel measurements. In some embodiments, the filter units 26, 28, 30 of the first signal processing path 18 and the filter units 34, 36, 38 of the second signal processing path 20 may be reconfigured by a global optimization of filter coefficients of all filter units 26, 28, 30, 34, 36, 38.

In some embodiments, if the frequency bands associated with the different input signals overlap, the control module 22 may perform a joint optimization of the filter coefficients of the filter units 26, 28, 30, 34, 36, 38 of the different signal processing paths 18, 20 at least in an overlap region of the frequency bands.

In the case of the signal processing system of FIG. 3, the control module 22 may reconfigure the software filter unit 44 of the analysis module 42 together with the hardware filter units 26, 28, 34, 36 of the signal processing paths 18, 20. Otherwise, the explanations regarding the signal processing system 10 of FIG. 2 also apply to the case of FIG. 3.

Certain embodiments disclosed herein, for example the respective module(s), units, etc., may utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be used synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the components described above, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal processing system, comprising:
 at least one signal processing path and a control module, the at least one signal processing path comprising at least two filter units and at least one signal input being connectable to at least one external electronic component, the at least two filter units comprise at least one hardware filter unit,
 the control module being connected to the signal input and to the at least two filter units, wherein the control module includes control circuitry configured to:
 determine a frequency response deviation being associated with the at least one external electronic component, and
 reconfigure the at least one hardware filter unit such that the frequency response deviation is compensated at least partially, thereby compensating disturbances caused by the at least one external electronic component;
 wherein the control circuitry is further configured to at least one of determine or receive a target aggregate frequency response, the target aggregate frequency response corresponding to an ideal frequency response for the complete signal chain from and including the at least one external electronic component to and including the at least one signal processing path, and wherein the frequency response deviation is a deviation of an actual frequency response of the signal chain from and including the at least one external electronic component to and including the at least one signal processing path from the target aggregate frequency response.

2. The signal processing system of claim 1, wherein the control module circuitry is configured to reconfigure the at least one hardware filter unit based on the target aggregate frequency response.

3. The signal processing system of claim 1, wherein the signal processing system comprises a user interface, wherein the target aggregate frequency response is adaptable by the user interface.

4. The signal processing system of claim 1, wherein the control module circuitry is configured to at least one of determine or receive at least one target computation parameter, the target computation parameter being associated with requirements regarding the target aggregate frequency response.

5. The signal processing system of claim 4, wherein the signal processing system comprises a user interface, wherein the at least one target computation parameter is adaptable by the user interface.

6. The signal processing system of claim 4, wherein the target computation parameter is associated with at least one of a target computation accuracy, a target computation time, a target energy consumption, a trigger impact, a ripple in amplitude, a ripple in phase, or a filter optimization criterion.

7. The signal processing system of claim 1, wherein the control module circuitry is configured to at least one of determine or receive filter property information being associated with the at least one hardware filter unit.

8. The signal processing system of claim 7, wherein the control module circuitry is configured to reconfigure the at least one hardware filter unit based on the filter property information.

9. The signal processing system of claim 7, wherein the filter property information comprises information on at least one of a number of filter taps, filter coefficients being real or complex, a sampling rate, a center frequency, a dynamic range, bits available for each hardware filter unit, an order of the at least two filter units in the at least one signal processing path, side parameters, or zero stuffing.

10. The signal processing system of claim 1, wherein the at least two filter units comprise at least two hardware filter units.

11. The signal processing system of claim 10, wherein the control module circuitry is configured to reconfigure the at least two hardware filter units in a consecutive manner.

12. The signal processing system of claim 1, wherein the at least one signal processing path comprises at least one software filter unit, the at least one software filter unit being connected to the control module, and the control module circuitry being configured to reconfigure the at least one software filter unit in addition to the reconfiguration of the at least one hardware filter unit such that the frequency response deviation is compensated.

13. The signal processing system of claim 12, wherein the control module circuitry is configured to reconfigure the at least one hardware filter unit and the at least one software filter unit in a consecutive manner, wherein the at least one software filter is reconfigured after the at least one hardware filter unit.

14. The signal processing system of claim 1, wherein the control module circuitry is configured to reconfigure the at least two filter units by a global optimization of filter coefficients of the at least two filter units.

15. The signal processing system of claim 1, further comprising at least one further signal processing path comprising a signal input and at least two filter units, the at least two filter units comprising at least one hardware filter unit, the at least one signal input of the at least one further signal processing path being connectable to at least one external electronic component, the control module being connected to the signal input and to the at least two filter units of the at least one further signal processing path, the control module circuitry being configured to determine a frequency response deviation being associated with the at least one external electronic component, and the control module circuitry further being configured to reconfigure the at least one hardware filter unit of the at least one further signal processing path such that the frequency response deviation is compensated at least partially.

16. The signal processing system of claim 15, further comprising an analysis module being connected to the at least one signal processing path and to the at least one further signal processing path, the analysis module including circuitry configured to perform multi-channel measurements.

17. The signal processing system of claim 16, wherein the control module circuitry is configured to reconfigure the filter units of the at least one signal processing path and the filter units of the at least one further signal processing path by a global optimization of filter coefficients of the filter units.

18. The signal processing system of claim 1, wherein the at least one external electronic component comprises at least one of a device under test, an external front end, an external amplifier, a cabling, a probe, or user equipment.

19. The signal processing system of claim 1, wherein the at least one hardware filter unit is established as an analog filter unit or as a digital filter unit.

20. A signal processing method for adapting filter coefficients of a signal processing system, the signal processing system comprising at least one signal processing path and a control module having control circuitry, the at least one signal processing path comprising at least one signal input and at least two filter units, the at least two filter units comprising at least one hardware filter unit, the at least one signal input being connectable to at least one external electronic component, the signal processing method comprising:
determining a frequency response deviation being associated with the at least one external electronic component by the control module; and
adapting filter coefficients of the at least two filter units such that the frequency response deviation is compensated at least partially,
wherein the filter coefficients are adapted by a global optimization of the filter coefficients of the at last two filter units, thereby compensating disturbances caused by the at least one external electric component.

21. The signal processing method of claim 20, wherein the filter coefficients are adapted by a least squares technique.

22. The signal processing method of claim 20, wherein a target aggregate frequency response is at least one of determined and received, the target aggregate frequency response being associated with both the at least one external electronic component and the at least one signal processing path, wherein the filter coefficients are adapted based on the target aggregate frequency response.

23. The signal processing method of claim 20, wherein at least one target computation parameter is at least one of determined or received, and wherein the filter coefficients are adapted based on the target computation parameter.

24. The signal processing method of claim 20, wherein filter property information being associated with the at least one hardware filter unit is at least one of determined or received, and wherein the filter coefficients are adapted based on the filter property information.

* * * * *